United States Patent
Yamamoto et al.

(10) Patent No.: US 11,508,875 B2
(45) Date of Patent: *Nov. 22, 2022

(54) SEMICONDUCTOR LIGHT-EMITTING DEVICE AND METHOD OF MANUFACTURING THE SAME

(71) Applicant: DOWA Electronics Materials Co., Ltd., Tokyo (JP)

(72) Inventors: Jumpei Yamamoto, Akita (JP); Tetsuya Ikuta, Akita (JP)

(73) Assignee: DOWA Electronics Materials Co., Ltd., Tokyo (JP)

( * ) Notice: Subject to any disclaimer, the term of this patent is extended or adjusted under 35 U.S.C. 154(b) by 99 days.

This patent is subject to a terminal disclaimer.

(21) Appl. No.: 16/955,043

(22) PCT Filed: Dec. 20, 2018

(86) PCT No.: PCT/JP2018/047001
§ 371 (c)(1),
(2) Date: Jun. 18, 2020

(87) PCT Pub. No.: WO2019/124497
PCT Pub. Date: Jun. 27, 2019

(65) Prior Publication Data
US 2020/0381589 A1    Dec. 3, 2020

(30) Foreign Application Priority Data
Dec. 22, 2017   (JP) .............................. JP2017-246594

(51) Int. Cl.
*H01L 33/00*    (2010.01)
*H01L 33/04*    (2010.01)
(Continued)

(52) U.S. Cl.
CPC .......... *H01L 33/30* (2013.01); *H01L 33/0062* (2013.01); *H01L 33/40* (2013.01);
(Continued)

(58) Field of Classification Search
CPC ..... H01L 33/40; H01L 33/0062; H01L 33/62; H01L 33/405; H01L 33/46; H01L 33/30;
(Continued)

(56) References Cited

U.S. PATENT DOCUMENTS 6,878,562 B2 * 4/2005 Ooi ........................ B82Y 20/00
                                                    438/45
7,691,656 B2 * 4/2010 Bader ................... H01L 33/405
                                                    257/E33.068
(Continued)

FOREIGN PATENT DOCUMENTS

JP    H023293 A    1/1990
JP    H04249384 A  9/1992
(Continued)

OTHER PUBLICATIONS

Nov. 9, 2021, Notification of Reasons for Refusal issued by the Japan Patent Office in the corresponding Japanese Patent Application No. 2017-246594.

(Continued)

*Primary Examiner* — Savitri Mulpuri
(74) *Attorney, Agent, or Firm* — Kenja IP Law PC

(57) ABSTRACT

To provide a bonding-type semiconductor light-emitting device which has excellent reliabilities with smaller time deviations of the light output power and the forward voltage. A semiconductor light-emitting device 100 according to the present disclosure includes a conductive support substrate 80; a metal layer 60 containing a reflective metal provided on the conductive support substrate 10; a semiconductor laminate 30 formed from a stack of a plurality of InGaAsP
(Continued)

group III-V compound semiconductor layers containing at least In and P provided on the reflective metal layer 60; an n-type InGaAs contact layer 20A provided on the semiconductor laminate 30; and an n-side electrode 93 provided on the n-type InGaAs contact layer 20A, wherein the center emission wavelength of light emitted from the semiconductor laminate 30 is 1000 to 2200 nm.

2 Claims, 9 Drawing Sheets

(51) Int. Cl.
  *H01L 33/30* (2010.01)
  *H01L 33/40* (2010.01)
  *H01L 33/46* (2010.01)
  *H01L 33/62* (2010.01)

(52) U.S. Cl.
  CPC .............. *H01L 33/46* (2013.01); *H01L 33/62* (2013.01); *H01L 2933/0016* (2013.01); *H01L 2933/0025* (2013.01); *H01L 2933/0066* (2013.01)

(58) Field of Classification Search
  CPC ..... H01L 2933/0025; H01L 2933/0016; H01L 2933/0066; H01L 33/06
  See application file for complete search history.

(56) References Cited

U.S. PATENT DOCUMENTS

| | | | | |
|---|---|---|---|---|
| 8,110,425 B2* | 2/2012 | Yun | ..................... | H01L 33/0075 438/47 |
| 8,318,519 B2* | 11/2012 | Doan | .................. | H01L 33/0093 438/33 |
| 8,871,547 B2* | 10/2014 | Chu | ..................... | H01L 33/0075 257/E33.001 |
| 10,181,537 B2* | 1/2019 | Sweeney | .................. | H02J 50/30 |
| 10,840,408 B1* | 11/2020 | Yin | .......................... | H01L 33/06 |
| 11,205,739 B2* | 12/2021 | Yamamoto | .............. | H01L 33/22 |
| 2007/0194325 A1* | 8/2007 | Sung | ................... | H01L 33/0093 257/79 |
| 2010/0329297 A1 | 12/2010 | Rumpler et al. | | |
| 2017/0012171 A1* | 1/2017 | Ko | .......................... | H01L 33/06 |
| 2019/0207055 A1* | 7/2019 | Yamamoto | .......... | H01L 33/0062 |
| 2020/0020828 A1* | 1/2020 | Yamamoto | .............. | H01L 33/40 |

FOREIGN PATENT DOCUMENTS

| | | |
|---|---|---|
| JP | H05190970 A | 7/1993 |
| JP | H06112531 A | 4/1994 |
| JP | H07111339 A | 4/1995 |
| JP | H09181398 A | 7/1997 |
| JP | H10116786 A | 5/1998 |
| JP | 2000068597 A | 3/2000 |
| JP | 2008283096 A | 11/2008 |
| JP | 2011165800 A | 8/2011 |
| JP | 2013251341 A | 12/2013 |
| TW | 200917530 A | 4/2009 |
| TW | 201234660 A | 8/2012 |
| WO | 9745881 A1 | 12/1997 |

OTHER PUBLICATIONS

Jul. 16, 2021, Office Action issued by the Korean Intellectual Property Office in the corresponding Korean Patent Application No. 10-2020-7015065.

Jan. 5, 2022, Office Action issued by the Korean Intellectual Property Office in the corresponding Korean Patent Application No. 10-2020-7015065.

Mar. 26, 2019, International Search Report issued in the International Patent Application No. PCT/JP2018/047001.

Jun. 23, 2020, International Preliminary Report on Patentability issued in the International Patent Application No. PCT/JP2018/047001.

Apr. 19, 2022, Notification of Reasons for Refusal issued by the Japan Patent Office in the corresponding Japanese Patent Application No. 2017-246594.

Sep. 6, 2022, Decision of Refusal issued by the Japan Patent Office in the corresponding Japanese Patent Application No. 2017-246594.

Sep. 6, 2022, Decision of Dismissal of Amendment issued by the Japan Patent Office in the corresponding Japanese Patent Application No. 2017-246594.

* cited by examiner

Step 32

Step 34

Step 36

Step 40

Step 50

Step 71

Step 72

Step 73

Step 74

Step 72

Step 74

Step 74

Plane Section I-I   Plane Section II-II

Step 75

Plane Section I-I   Plane Section II-II

Step 76

Plane Section I-I   Plane Section II-II

SEMICONDUCTOR LIGHT-EMITTING DEVICE AND METHOD OF MANUFACTURING THE SAME

TECHNICAL FIELD

The present disclosure relates to a semiconductor light-emitting device and a method of manufacturing the same, particularly to a bonding-type semiconductor light-emitting device having a center emission wavelength 1000 to 2200 nm, and a method of manufacturing the same.

BACKGROUND

Semiconductor light-emitting devices have been well-known which emit light in a wavelength of 750 nm or more in the infrared region. They are widely used in applications such as sensors, gas analysis, and surveillance cameras.

When the center emission wavelength of such a semiconductor light-emitting device is 1000 nm to 2200 nm in a near infrared region, an InGaAsP-based III-V semiconductor containing In and P is generally used as a light-emitting layer. For epitaxially growing an InGaAsP-based III-V semiconductor layer such as an InP layer, an InP substrate is conventionally used as a growth substrate so that the InGaAsP-based III-V semiconductor layer containing In and P is lattice matched with the growth substrate.

For example, PTL 1 discloses an InGaAsP—InP based semiconductor light-emitting device including an n-type InP substrate; and active layers, a p-type cladding layer, a p-type InGaAs layer, and a p-type InGaAsP ohmic contact layer, provided on the n-type InP substrate in this order.

CITATION LIST

Patent Literature

PTL 1: JP H06-112531A

SUMMARY

Technical Problem

As in the technique disclosed in PLT 1, for fabricating a semiconductor light-emitting device having a center emission wavelength of 1000 nm to 2200 nm in the near infrared region, an InP substrate serving as a growth substrate is used as is as a support substrate for the semiconductor light-emitting device. This is because InP substrates are transparent to light in the near-infrared region and thus cause no obstruction to transmit infrared light.

In the meantime, demands for wearable devices have been recently created the needs for size reduction in semiconductor light-emitting devices which emit light in the infrared region, and particularly the needs for reduction in the thicknesses (i.e. total thicknesses) of semiconductor light-emitting devices has been increasing.

In general, commercially available InP substrates are 350 μm in thickness for 2-inch substrates. On the contrary, the thicknesses of components other than the InP substrate, such as InGaAsP-based III-V semiconductor layers and electrodes, provided in a semiconductor light-emitting device are about several micrometers at most. Thus, the thickness of the substrate accounts for the majority of the thickness of a semiconductor optical device. We have studied to thin substrates for reducing the thicknesses of devices, only to find that InP substrates broke when the substrates were excessively grinded to the thicknesses of 150 μm or less, for example.

We have thus attempted to fabricate a bonding-type semiconductor light-emitting device by forming a semiconductor laminate having an n-type semiconductor layer, active layers, and a p-type semiconductor layer, on an n-type InP growth substrate; then bonding the semiconductor laminate to a conductive support substrate having a metal layer interposed therebetween; and removing the growth substrate. Since a bonding-type semiconductor light-emitting device can use a conductive support substrate in place of an InP substrate, reduction in the total thickness of the semiconductor light-emitting device might be achieved by thinning the conductive support substrate.

In the bonding-type semiconductor light-emitting device fabricated in the above-mentioned processes, the n-type semiconductor layer is required to be grown so as to be lattice matched with the n-type InP grown substrate and the active layers, which are to sandwich the n-type semiconductor layer. For the reason, an InGaAsP-based III-V group compound semiconductor layer containing at least In and P such as n-type InP layer is used as the n-type semiconductor layer. This n-type semiconductor layer (e.g., n-type InP layer serving as an n-type cladding layer) will establish an ohmic contact to an n-side electrode.

In a conventional semiconductor light-emitting device in which an n-type InP substrate serves as a support substrate, like the one disclosed in PTL 1, an n-side electrode is provided on the surface opposite to the growth surface of the n-type InP substrate such that an ohmic contact is established between the n-type InP substrate and the n-side electrode.

In place of a conventional semiconductor light-emitting device having an n-type InP substrate serving as a support substrate, we fabricated a bonding-type semiconductor light-emitting device and evaluated the light emission characteristics thereof. Time degradations were observed in this bonding-type semiconductor light-emitting device for both the light output power and the forward voltage. Particularly, the time degradation of the forward voltage was an unexpected result. Thus, we found a new challenge to improve reliabilities in terms of the time deviations of the light output power and the forward voltage.

Accordingly, the present disclosure is to provide a bonding-type semiconductor light-emitting device having a center emission wavelength 1000 to 2200 nm, which has excellent reliabilities with smaller time deviations of the light output power and the forward voltage, and a method of manufacturing the same.

Solution to Problem

We diligently studied ways to address the above challenge, and focused on an n-type semiconductor layer which is to establish an ohmic contact with an n-side electrode. We then gained an idea to provide an n-type InGaAs contact layer (InGaAs not containing P) in place of an InGaAsP-based III-V group compound semiconductor layer containing at least In and P. We found that the n-type InGaAs contact layer improved the time deviations of the light output power and the forward voltage of the semiconductor light-emitting device, thereby completing the present disclosure. Specifically, the subject matter of the present disclosure is as follows:

(1) A semiconductor light-emitting device comprising:
a conductive support substrate;
a metal layer comprising a reflective metal provided on the conductive support substrate;
a semiconductor laminate provided on the metal layer, the semiconductor laminate being a stack of a plurality of InGaAsP-based III-V group compound semiconductor layers containing at least In and P;
an n-type InGaAs contact layer provided on the semiconductor laminate; and
an n-side electrode provided on the n-type InGaAs contact layer,
wherein a center emission wavelength of light emitted from the semiconductor laminate is 1000 to 2200 nm.

(2) The semiconductor light-emitting device according to (1), wherein the n-type InGaAs contact layer has an In composition ratio of 0.47 or more and 0.60 or less.

(3) The semiconductor light-emitting device according to (1) or (2), wherein the n-side electrode contains one of Au and Ge, and Ti, Pt, and Au.

(4) The semiconductor light-emitting device according to any one of (1) to (3), wherein the semiconductor laminate comprises a p-type cladding layer, active layers, and an n-type cladding layer, in this order from a side of the metal layer.

(5) A method of manufacturing a semiconductor light-emitting device, comprising:
a first step of forming an n-type InGaAs contact layer comprising an n-side electrode forming region, on an n-type InP growth substrate;
a second step of forming a semiconductor laminate by stacking a plurality of InGaAsP-based III-V group compound semiconductor layers containing at least In and P, on the n-type InGaAs contact layer;
a third step of forming a reflective metal layer on the semiconductor laminate;
a fourth step of bonding a conductive support substrate having a surface provided with a metal bonding layer to the reflective metal layer, having the metal bonding layer interposed therebetween;
a fifth step of removing the n-type InP growth substrate; and
a sixth step of partially removing the n-type InGaAs contact layer to provide the semiconductor laminate with an exposed surface while forming an n-side electrode on the n-side electrode forming region of the n-type InGaAs contact layer,
wherein a center emission wavelength of light emitted from the semiconductor laminate is 1000 to 2200 nm.

(6) The method of manufacturing a semiconductor light-emitting device according to (5), wherein an In composition ratio of the n-type InGaAs contact layer formed in the first step is set to 0.47 or more and 0.60 or less.

(7) The method of manufacturing a semiconductor light-emitting device according to (5) or (6), wherein the n-side electrode contains one of Au and Ge, and Ti, Pt, and Au.

(8) The method of manufacturing a semiconductor light-emitting device according to any one of (5) to (7), wherein the semiconductor laminate comprises an n-type cladding layer, active layers, and a p-type cladding layer, in this order from a side of the n-type InGaAs contact layer.

Advantageous Effect

According to the present disclosure, a bonding-type semiconductor light-emitting device having a center emission wavelength 1000 to 2200 nm, which has excellent reliabilities with smaller time deviations of the light output power and the forward voltage, and a method of manufacturing the same, can be provided.

DETAILED DESCRIPTION

Figure 1:
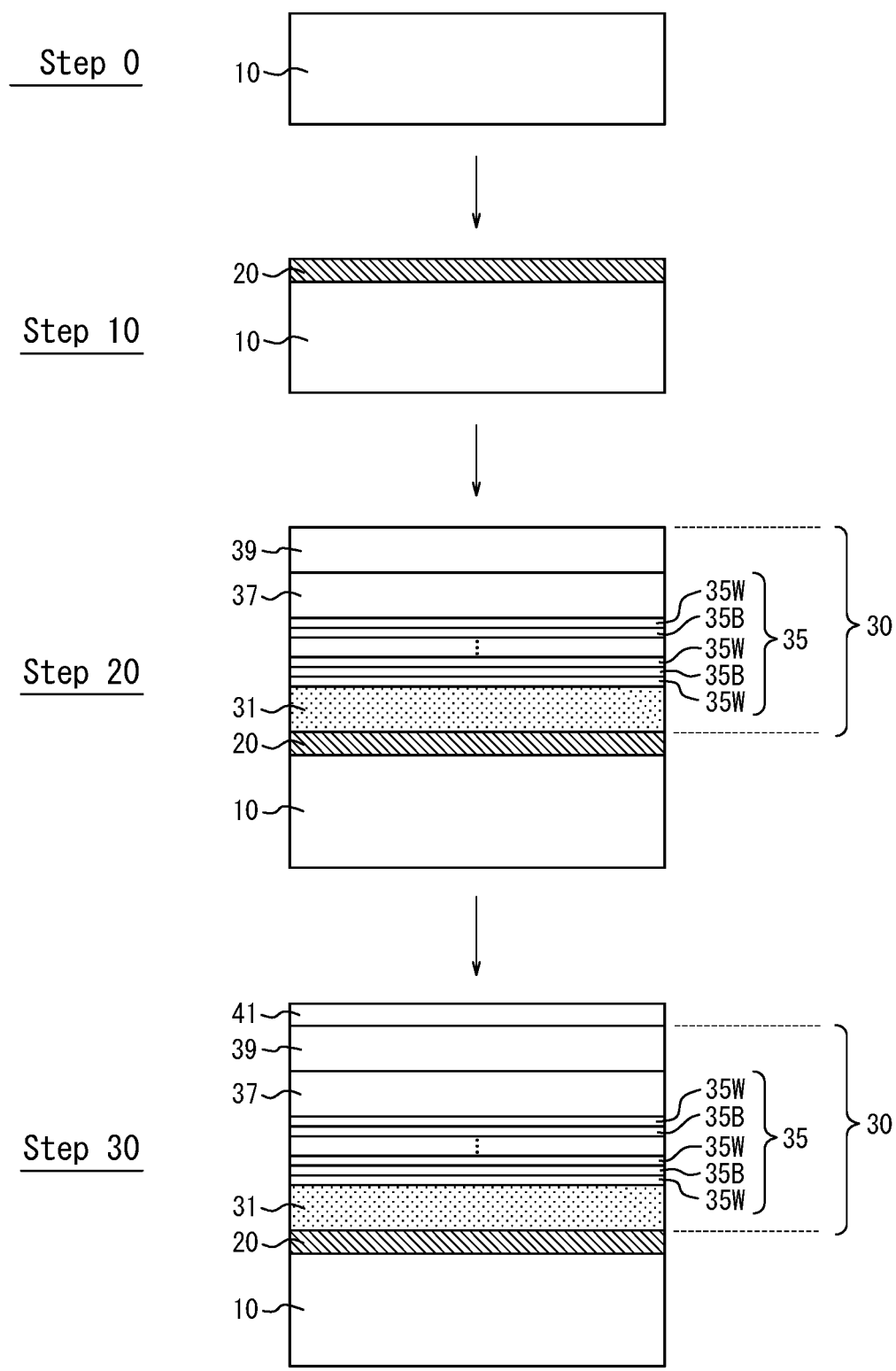
FIG. 1 is a schematic cross-sectional view illustrating parts of steps for manufacturing a semiconductor light-emitting device according to an embodiment of the present disclosure.

Prior to describing embodiments of this disclosure, the following points are described beforehand. First, in this specification, the expression "InGaAsP" alone for which the composition ratio is not specified means a given compound having a chemical composition ratio of group III elements (In and Ga in total) with respect to group V elements (As and P) of 1:1, in which the ratio between In and Ga that are group III elements and the ratio between As and P that are group V elements are undefined. In this case, there may be a possibility that one of In and G is not contained as the group III elements; or there may be a possibility that one of As and P is not contained as the group V elements. However, InGaAsP specified as "containing at least In and P" means that more than 0% and 100% or less of In is contained in the group III elements, and more than 0% and 100% or less of P is contained in the group V elements. Further, the expression "InGaP" means that As is not contained in the above-mentioned "InGaAsP" except for inevitable contamination in production, and the expression "InGaAs" means that P is not contained in the above-mentioned "InGaAsP" except for inevitable contamination in production. Similarly, the expression "InAsP" means that Ga is not contained in the above-mentioned "InGaAsP" except for inevitable contamination in production, and the expression "GaAsP" means that In is not contained in the above-mentioned "InGaAsP" except for inevitable contamination in production. Further, the expression "InP" means that Ga and As are not contained in the above-mentioned "InGaAsP" except for inevitable contamination in production. Note that the values of the composition ratios of InGaAsP, InGaAs, and the like can be measured for example by a photoluminescence measurement or an X-ray diffraction measurement. Further, as used herein, the term "inevitable contamination in production" refers to inevitable contamination originated from a manufacturing apparatus where source gases are used, as well as diffusions of atoms at interfaces between layers upon crystal growth or a subsequent heat treatment, and the like.

In this specification, a layer serving as an electrically p-type layer is referred to as a p-type layer, and a layer serving as an electrically n-type layer is referred to as an n-type layer. Meanwhile, a layer that is not intentionally doped with certain impurities such as Zn, S, and Sn and does not serve as an electrically p-type or n-type layer is referred to as an "i-type" or "undoped" layer. An undoped layer may contain impurities that are inevitably mixed in the production process. Specifically, when the carrier density is low (for example, less than $4 \times 10^{16}/cm^3$), the layer is regarded as being "undoped" in this specification. Further, the values of the impurity concentrations of Zn, Sn, etc. are determined by SIMS analyses.

The total thickness of layers formed can be measured using an interference thickness measurement system. Moreover, the thickness of each layer can be calculated by observing a cross section of the growth layer using a thickness measurement system using optical interferometry and a transmission electron microscope. When the thickness of each layer is small as in a superlattice structure, the thickness can be measured using TEM-EDS. Note that when a certain layer has an inclined surface in a cross-sectional view, the thickness of the layer is defined by the maximum height of the layer from a flat surface of the underlying layer.

Embodiments of the present disclosure will now be described with reference to the drawings. For convenience of explanation, a method of manufacturing a semiconductor light-emitting device 100 according to an embodiment of the present disclosure will first be described, and the details of the semiconductor light-emitting device 100 will then be described. The semiconductor light-emitting device 100 can be manufactured according to an embodiment of a method of manufacturing a semiconductor light-emitting device 100 described with reference to FIGS. 1 to 4, and can be obtained through at least first to sixth steps. For simplifying the drawings, each of Steps 0 to 80 illustrated in FIGS. 1 to 4 is illustrated to include one or more steps. Accordingly, each step in the drawings does not necessarily have one-to-one correspondence with each step according to the present embodiment. In principle, like components are denoted by the same reference numerals, and the description of those components will not be repeated. A substrate and layers in each drawing are exaggerated in width and thickness for convenience of description, so that the ratio between the vertical and horizontal dimensions of each illustrated component does not conform to the actual ratio.

(Method of Manufacturing Semiconductor Light-Emitting Device)

A method of manufacturing a semiconductor light-emitting device 100 according to an embodiment of the present disclosure includes at least first, second, third, fourth, fifth, and sixth steps described below in detail. Additional steps may be included if desired. An intermediate layer forming step including Step 30 to Step 36 (see FIGS. 1 and 2), and a surface roughening step for a surface of an n-type cladding layer 31 including Step 71 to Step 76 (see FIGS. 7 to 9), which will be described in detail later, are specific examples of preferred steps that are preferably included in the manufacturing method according to the present disclosure.

In the first step, an n-type InGaAs contact layer 20 is formed on an n-type InP growth substrate 10 (Step 0 and Step 10 in FIG. 1). In the second step, a semiconductor laminate 30 is formed on the n-type InGaAs contact layer 20 (Step 20 in FIG. 1). In the third step, a reflective metal layer 60A is formed on the semiconductor laminate 30 (Step 40 in FIG. 3). In the fourth step, a conductive support substrate 80 having a surface provided with a metal bonding layer 60B is bonded to a reflective metal layer 60A having the metal bonding layer 60B interposed therebetween (Step 50 in FIG. 4). In the fifth step, the n-type InP growth substrate 10 is removed (Step 60 in FIG. 4). In the sixth step, the n-type InGaAs contact layer 20 is partially removed to provide the semiconductor laminate 30 with an exposed surface while an n-side electrode 93 is formed on an n-side electrode forming region 20A of the n-type InGaAs contact layer 20 (Step 70A or Step 70B, and Step 80 in FIG. 4). Here, the center emission wavelength of light emitted from the semiconductor laminate 30 formed in the second step is set to 1000 to 2200 nm. The semiconductor light-emitting device 100 according to an embodiment of the present disclosure is thus manufactured. In the following, the details of each step will be described in sequence.

<First Step>

As described above, in a first step, an n-type InGaAs contact layer 20 is formed on an n-type InP growth substrate 10. First, as illustrated in Step 0 in FIG. 1, the n-type InP growth substrate 10 is provided. Commercially available substrates can be used as the n-type InP growth substrate 10 in the present embodiment, and the size and thicknesses of the substrate is not particularly limited and a so-called 2-inch substrate, 3-inch substrate, 4-inch substrate, and 6-inch substrate may be used.

Then, in the first step, an n-type InGaAs contact layer 20 is formed on the n-type InP growth substrate 10 (Step 10 in FIG. 1). Here, the In composition ratio of the n-type InGaAs contact layer 20 is not limited as long as the InP growth substrate 10 and a semiconductor layer to be formed directly on the n-type InGaAs contact layer 20 (n-type cladding layer 31 in the present embodiment) are lattice matched with the n-type InGaAs contact layer 20 in the extent to permit crystal growths. Nevertheless, when the composition formula of the n-type InGaAs contact layer 20 is expressed as $In_zGa_{(1-z)}As$ where z represents the In composition ratio, a crystal growth is ensured when the In composition ratio z is 0.47 or more and 0.60 or less, and the In composition ratio z is more preferably 0.50 or more 0.57 or less. Note that InGaAs is perfectly lattice matched with InP is when the In composition ratio z is 0.532. For exerting a compressive distortion on the semiconductor laminate 30, z satisfies preferably z>0.532, more preferably z≥0.54.

Note that the n-type InGaAs contact layer 20 is not limited to a single layer having a constant composition, and may be composed of a plurality of layers having different In composition ratios z. In addition, the In composition ratio z of the n-type InGaAs contact layer 20 may have a gradient by increasing or decreasing the In composition ratio z in the thickness direction, for example. Further, the concentration of a dopant in the n-type InGaAs contact layer 20 may also be varied inside the layer.

<Second Step>

In a second step subsequent to the first step, on the n-type InGaAs contact layer 20, a semiconductor laminate 30 formed from a stack of a plurality of InGaAsP-based III-V group compound semiconductor layers containing at least In and P is formed (Step in FIG. 1). The semiconductor laminate 30 may include an n-type cladding layer 31, active layers 35, and a p-type cladding layer 37 in this order, and each of these layers is formed as a layer made of InGaAsP-based III-V group compound semiconductor containing at least In and P.

The composition of each layer in the semiconductor laminate 30 is not particularly limited as long as the center emission wavelength of light emitted from the active layers in the semiconductor laminate 30 becomes 1000 to 2200 nm. The semiconductor laminate 30 may have a double hetero (DH) structure in which the active layers 35 are sandwiched between the n-type cladding layer 31 and the p-type cladding layer 37. Furthermore, the active layers 35 may have a multiple quantum-well (MQW) structure. With a view to improving the light output power by reducing crystal defects, the semiconductor laminate 30 more preferably has a multiple quantum-well structure. The multiple quantum-well structure can be formed by alternately and repeatedly providing well layers 35W and barrier layers 35B. The layers on both ends of the active layers 35 in the thickness direction (i.e., the top and bottom layers) are preferably barrier layers. Accordingly, when the number of repetitions of the well layers 35W and the barrier layers 35B is n, those layers are referred to as a "multiple quantum-well structure of n.5 pairs". Further, the well layers 35W may be of InGaAsP, and the barrier layers 35B are preferably of InGaAsP having a larger band gap than that of the well layers 35W. A provision of such a semiconductor laminate 30 as described above allows the semiconductor light-emitting device 100 to emit light having a wavelength in a desired near-infrared region. For example, an emission peak wavelength of 1000 nm to 1650 nm can be achieved by varying the composition of the InGaAsP-based III-V compound. In the case of a MQW structure, an emission peak wavelength of 1000 nm to 1900 nm can be achieved by applying a strain to the well layers by controlling the composition difference between the well layers and the barrier layers, in addition to varying the composition of the InGaAsP-based III-V compound. Note that the n-type cladding layer 31 is preferably an n-type InP cladding layer, and the p-type cladding layer 37 is preferably a p-type InP cladding layer. Further, when the chemical composition of the well layers 35W is expressed as $In_{xw}Ga_{1-xw}As_{yw}P_{1-yw}$, $0.5 \leq xw \leq 1$ and $0.5 \leq yw \leq 1$ can be satisfied, and $0.6 \leq xw \leq 0.8$ and $0.3 \leq yw \leq 1$ are preferably satisfied. In addition, when the chemical composition of the barrier layers 35B is expressed as $In_{xb}Ga_{1-xb}As_{yb}P_{1-yb}$, $0.5 \leq xb \leq 1$ and $0 \leq yb \leq 0.5$ can be satisfied, and $0.8 \leq xb \leq 1$ and $0 \leq yb \leq 0.2$ are preferably satisfied.

Further, the total thickness of the semiconductor laminate 30 may be for example, but not limited to, 2 μm to 8 μm. Similarly, the thickness of the n-type cladding layer 31 may be for example, but not limited to, 1 μm to 5 μm. Further, the thicknesses of the active layers 35 may be for example, but not limited to, 100 nm to 1000 nm. Similarly, the thickness of the p-type cladding layer 37 may be for example, but not limited to, 0.8 μm to 3 μm. When the active layers 35 have a quantum well structure, the thickness of the well layers 35W may be 3 nm to 15 nm, and the thickness of the barrier layers 35B may be 5 nm to 15 nm. The number of pairs of both layers may be 3 to 50.

Further, the semiconductor laminate 30 preferably has a p-type cap layer 39 made of InGaAsP containing at least In and P on the p-type cladding layer 37. The lattice mismatch can be reduced by providing the p-type cap layer 39. The thickness of the cap layer 39 may be for example, but not limited to, 50 nm to 200 nm. In the following embodiment, for convenience of description, description is made assuming that the outermost surface layer of the semiconductor laminate 30 is the p-type cap layer 39; however, since the p-type cap layer 39 is an optional component, the outermost surface layer of the semiconductor laminate 30 may be for example, the p-type cladding layer 37.

Although not illustrated, the semiconductor laminate 30 preferably has an i-type InP spacer layer each between the n-type cladding layer 31 and the active layers and between the active layers 35 and the p-type cladding layer 37. The provision of the i-type InP spacer layers can hinder dopant diffusion. The thickness of the i-type InP spacer layers may be for example, but not limited to, 50 nm to 400 nm.

The n-type InGaAs contact layer 20 formed in the first step and the layers in the semiconductor laminate 30 formed in the second step can be formed by epitaxial growth, for example by a well-known thin film deposition technique such as metal organic chemical vapor deposition (MOCVD), molecular beam epitaxy (MBE), or sputtering. For example, trimethylindium (TMIn) may be used as an In source, trimethylgallium (TMGa) as a Ga source, arsine ($AsH_3$) as an As source, and phosphine ($PH_3$) as a P source at a predetermined mixing ratio, and these source gases may be subjected to vapor phase epitaxy using a carrier gas to form an InGaAsP layer having a desired thickness by controlling the growth time. Note that other InGaAsP layers that are epitaxially grown can be formed in the similar process. When the layers are p-type or n-type doped, a dopant source gas can be used in addition as desired.

<Third Step>

Figure 3:
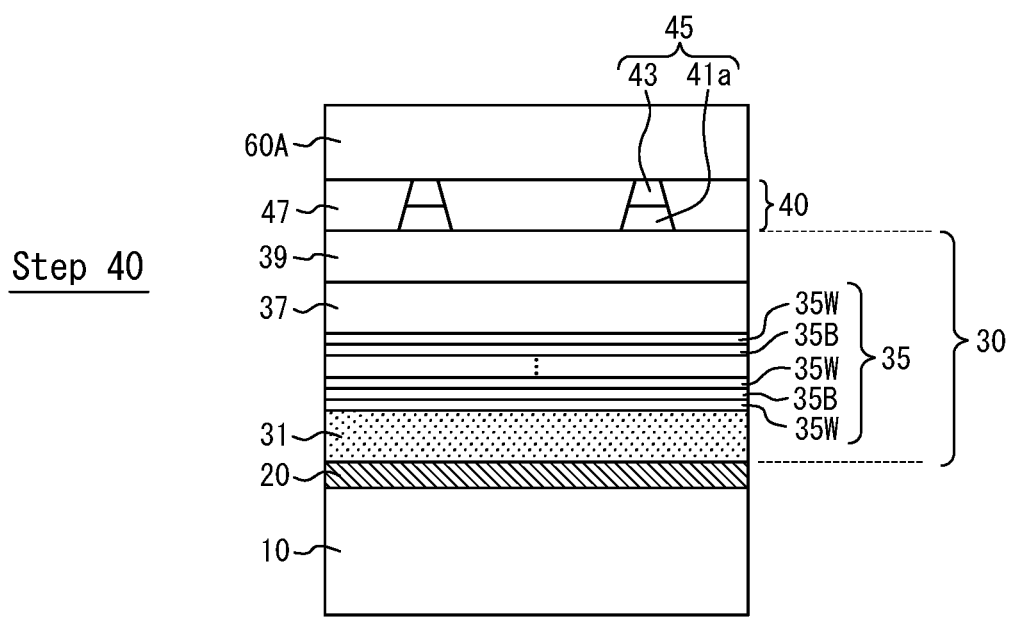
FIG. 3 is a schematic cross-sectional view subsequent to FIG. 2 illustrating parts of the steps for manufacturing the semiconductor light-emitting device according to an embodiment of the present disclosure.
Figure 3:
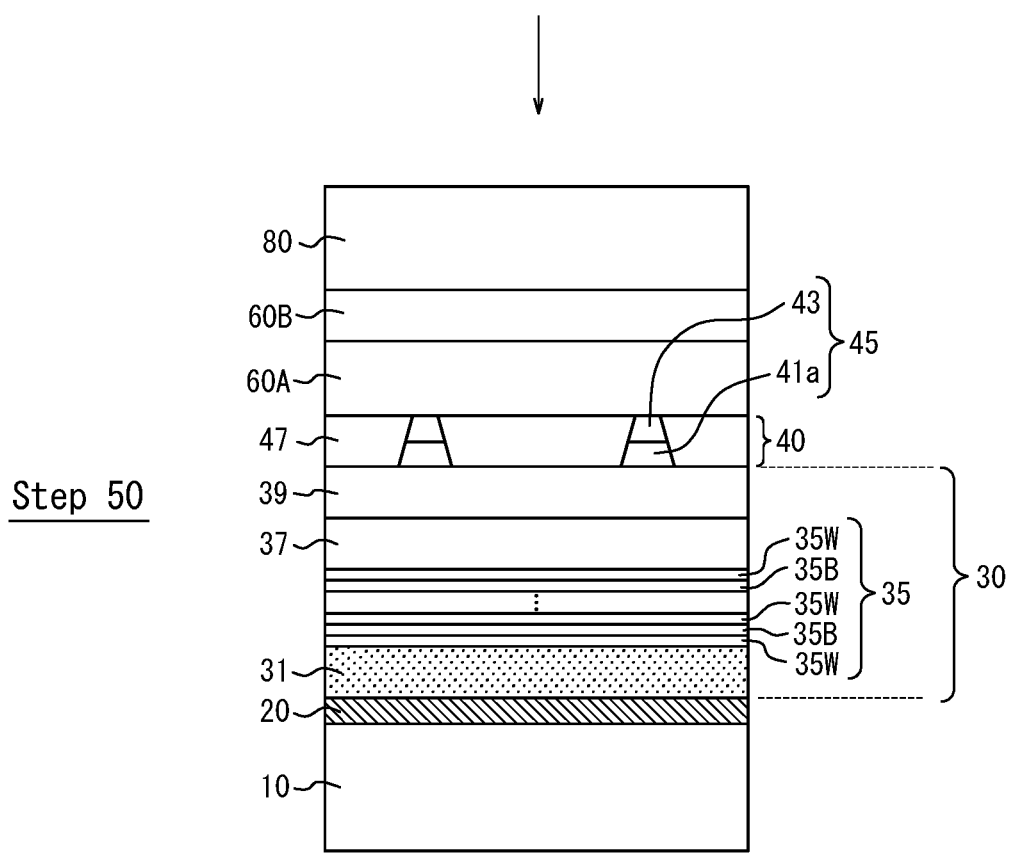

In a third step subsequent to the second step, a reflective metal layer 60A is formed on the semiconductor laminate 30 (Step 40 in FIG. 3). It is also preferred that an intermediate layer 40 is formed by carrying out an intermediate layer forming step which will be described later in detail, prior to the third step, and the reflective metal layer 60A is formed on the intermediate layer 40. The reflective metal layer 60A preferably contains Au as a main component. Specifically, Au is contained in the amount of preferably more than 50% by mass, more preferably 80% by mass or more in the composition of the reflective metal layer 60A. The reflective metal layer 60A may include a plurality of metal layers; however, when it includes a metal layer made of Au (hereinafter "Au metal layer"), the thickness of the Au metal layer is preferably more than 50% of the total thickness of the reflective metal layer 60A. Other than Au; Al, Pt, Ti, Ag, and the like, may be used as metals composing the reflective metal layer 60A (in other words, reflective metals). The reflective metal composing the reflective metal layer 60A serves as the source of the reflective metal contained in a metal layer 60 in the semiconductor light-emitting device 100 fabricated with an embodiment of the manufacturing method of the present disclosure. For example, the reflective metal layer 60A may be constituted by a single layer made of Au only; alternatively, the reflective metal layer 60A may include two or more Au metal layers. In order to ensure bonding with a metal bonding layer 60B in the subsequent fourth step, the outermost surface layer of the reflective metal layer 60A (the surface opposite to the semiconductor laminate 30) is preferably an Au metal layer. For example, metal layers of Al, Au, Pt, and Au may be formed in this order on the semiconductor laminate 30 (having an intermediate layer 40 disposed therebetween if desired) to obtain the reflective metal layer 60A. The thickness of one Au metal layer in the reflective metal layer 60A may be for example 400 nm to 2000 nm, and the thickness of each metal layer made of a metal other than Au may be for example 5 nm to 200 nm. The reflective metal layer 60A can be deposited on the semiconductor laminate 30 or on the intermediate layer 40 by any of typical techniques including vapor deposition.

<Fourth Step>

In a fourth step subsequent to the third step, a conductive support substrate 80 having a surface provided with a metal bonding layer 60B is bonded to the reflective metal layer 60A, having the metal bonding layer 60B interposed therebetween (Step 50 in FIG. 3). On a surface of the conductive support substrate 80, the metal bonding layer 60 may have been formed by sputtering, vapor deposition, or the like. The metal bonding layer 60B and the reflective metal layer 60A are placed so as to face each other, followed by bonding of the layers by thermocompression bonding at a temperature of approximately 250° C. to 500° C. By bonding the reflective metal layer 60A and the metal bonding layer 60B, a metal layer 60 containing the reflective metal is obtained.

The metal bonding layer 60B bonded to the reflective metal layer 60A may be of metals such as Ti, Pt, and Au, or metals forming a eutectic alloy with gold (e.g., Sn), and is preferably formed from a stack of those materials. For example, a stack obtained by stacking Ti with a thickness of 400 nm to 800 nm, Pt with a thickness of nm to 20 nm, and Au with a thickness of 700 nm to 1200 nm in this order on the surface of the conductive support substrate 80 can be used as the metal bonging layer 60B. Note that in order to facilitate bonding between the reflective metal layer 60A and the metal bonding layer 60B, a Au metal layer is provided as the outermost surface layer of the metal bonding layer 60B, and Au is also provided as a metal layer of the reflective bonding layer 60 on the metal bonding layer 60B side to perform bonding between Au and Au by Au—Au diffusion bonding.

The conductive support substrate 80 is preferably a conductive Si substrate. A Si substrate is advantageous in that it is resistant to break and can be thinned because Si substrates have higher hardness than that of InP substrates. Alternatively, a conductive GaAs or Ge substrate can also be used as the conductive support substrate 80.

<Fifth Step>

Figure 4:
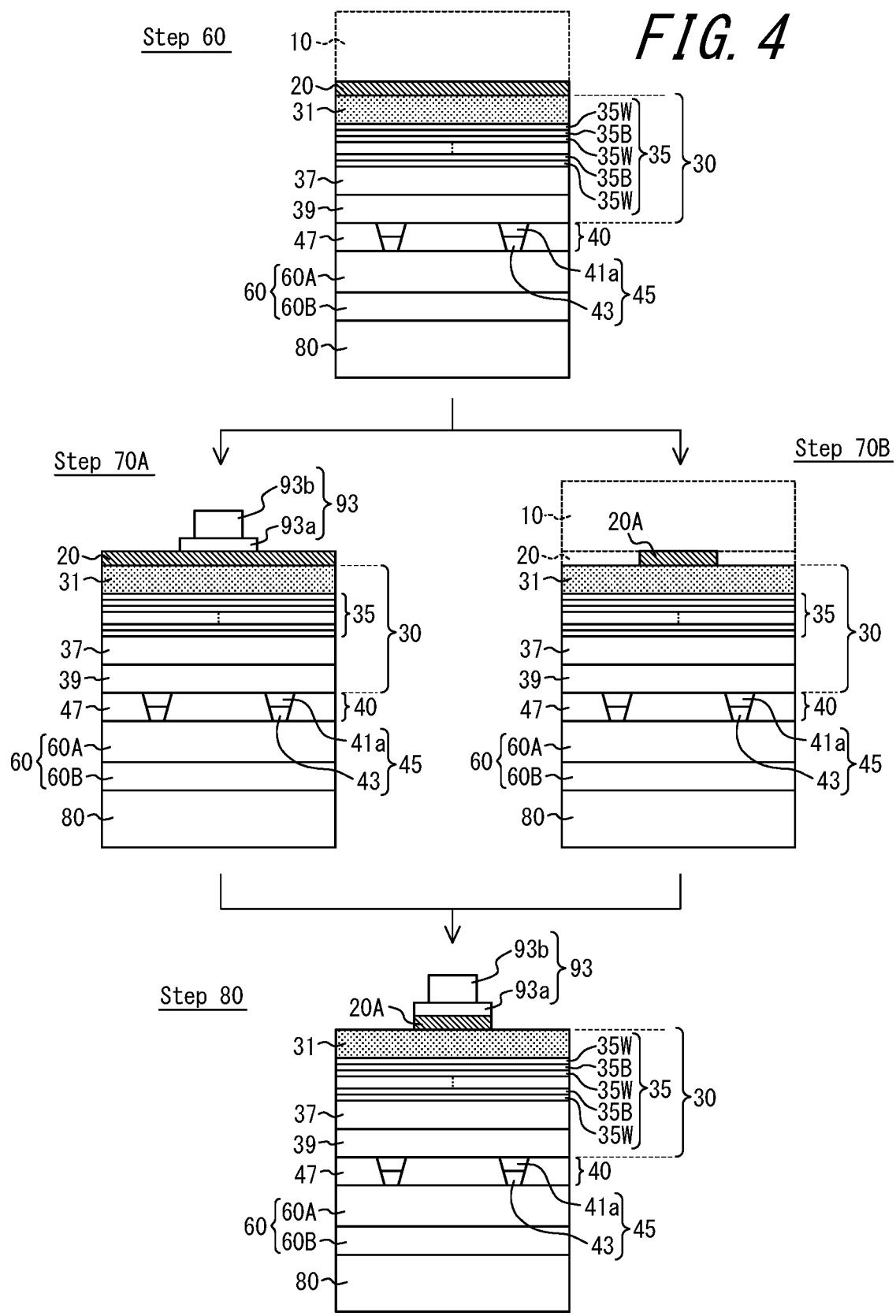
FIG. 4 is a schematic cross-sectional view subsequent to FIG. 3 illustrating parts of the steps for manufacturing the semiconductor light-emitting device according to an embodiment of the present disclosure.

In a fifth step subsequent to the fourth step, the n-type InP growth substrate 10 is removed (Step 60 in FIG. 4). The n-type InP growth substrate 10 can be removed, for example, by wet etching using a hydrochloric acid diluent, and the n-type InGaAs layer 20 can be utilized as an etch stop layer.

<Sixth Step>

In a sixth step, the n-type InGaAs contact layer 20 is partially removed to provide the semiconductor laminate 30 with an exposed surface while an n-side electrode 93 is formed on an n-side electrode forming region 20A of the n-type InGaAs contact layer 20 (Step 70A or Step 70B, and Step 80 in FIG. 4). After the n-side electrode 93 is provided on the n-side electrode forming region 20A, the n-type contact layer 20 may be partially removed (Step 70A in FIG. 4). Alternatively, the n-type contact layer 20 other than the n-side electrode forming region 20A may be removed beforehand, and then the n-side electrode 93 may be formed (Step 70B in FIG. 4). The n-type InGaAs contact layer 20 can be removed by wet etching in a sulfuric acid-hydrogen peroxide mixture.

Upon forming the n-side electrode 93 on the n-side electrode forming region 20A of the n-type InGaAs contact layer 20 (Step 80 in FIG. 4), the n-side electrode 93 may include a wiring portion 93a and a pad portion 93b. Further, the n-side electrode 93, particularly the wiring portion 93a preferably contains Au and Ge, or preferably contains Ti, Pt, and Au. The n-side electrode 93 containing these metallic elements ensures an ohmic contact with the n-type InGaAs contact layer 20A. Further, after the wiring portion 93a is formed, a heat treatment is preferably carried out for establishing an ohmic contact between the contact layer and the electrode. It is also preferable that the pad portion 93b is formed after the heat treatment.

Figure 5:
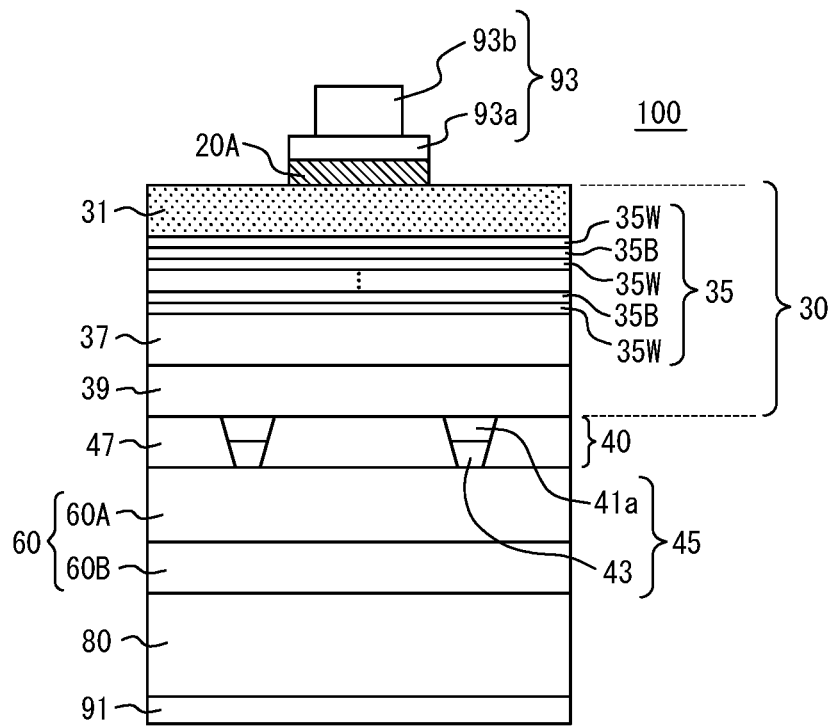
FIG. 5 is a schematic cross-sectional view of a semiconductor light-emitting device according to an embodiment of the present disclosure.

In the manufacturing method according to the present embodiment, a back electrode 91 may be formed on the back surface of the conductive support substrate 80 (see FIG. 5). The back electrode 91 and the n-side electrode 93 can be formed by a well-known technique; for example, sputtering, electron-beam vapor deposition, resistance heating, and the like. Further, prior to forming the back electrode 91, a grinding step may be carried out to grind the conductive support substrate 80. The grinding of the conductive support substrate 80 may be achieved by well-known mechanical grinding, and may be carried out in conjunction with etching. The thus obtained semiconductor light-emitting device 100 is illustrated in FIG. 5

The semiconductor light-emitting device 100 according to the present embodiment as illustrated in FIG. 5 can be produced through the above-mentioned first to sixth steps. Next, a description will be given on the intermediate layer forming step and the surface roughening step which are preferably carried out additionally in the method of manufacturing a semiconductor light-emitting device 100 according to the present embodiment.

<Intermediate Layer Step>

After the second step and prior to the third step, the intermediate layer forming step is preferably carried out for forming an intermediate layer 40, which will be described in detail below. In this step, initially, a p-type contact layer 41 made of a III-V compound semiconductor is formed on the semiconductor laminate 30 (Step 30 in FIG. 1). For example, in a preferred mode of Step 30 in FIG. 1, the p-type contact layer 41 is formed on the p-type cap layer 39. The p-type contact layer 41 is a layer which is to contact with an ohmic metal portion 43 to be formed thereon, and is to be interposed between the ohmic metal portion 43 and the semiconductor laminate 30. The p-type contact layer 41 has a composition allowing for lower contact resistance with the ohmic metal portion 43 than with the semiconductor laminate 30. For example, the p-type contact layer 41 can be a p-type InGaAs layer. The thickness of the contact layer 41 may be for example, but not limited to, 50 nm to 200 nm.

Subsequently, an ohmic metal portion 43 is formed on parts of the p-type contact layer 41 leaving an exposed area E1 on a surface of the p-type contact layer 41 (Step 32 in FIG. 2). The ohmic metal portion 43 can be formed into islands distributed in a predetermined pattern. When the p-type contact layer 41 is a p-type InGaAs, Au, AuZn, AuBe, AuTi, and the like can be used as the ohmic metal portion 43, for example, and a structure in which those materials are stacked is also preferably used as the ohmic metal portion 43. For example, Au/AuZn/Au may be used as the ohmic metal portion 43. The thickness (or the total thickness) of the ohmic meal portion 43 may be for example, but not limited to 300 nm to 1300 nm, preferably 350 nm to 800 nm.

For example, the ohmic metal portion 43 formed into islands distributed in a predetermined pattern can be formed by forming a resist pattern on the surface of the p-type contact layer 41, vapor depositing the ohmic metal portion 43, and removing the resist pattern by lift-off. Alternatively, the ohmic metal portion 43 may be formed by forming a predetermined metal layer on the entire surface of the contact layer 41, forming a mask on the metal layer, and performing for example etching. In either case, as illustrated in Step 32 in FIG. 2, the ohmic metal portion 43 is formed on parts of the p-type contact layer 41, and the surface of the p-type contact layer 41 which is not in contact with the ohmic metal portion 43, i.e., the exposed area E1, may be formed Note that the shape of the ohmic metal portion 43 may be a trapezoidal shape in a cross-sectional view in some cases as illustrated in Step 32 in FIG. 2 by way of schematic illustration only. The ohmic metal portion 43 may be formed into a rectangular shape or may have rounded corners in a cross-sectional view.

Figure 2:
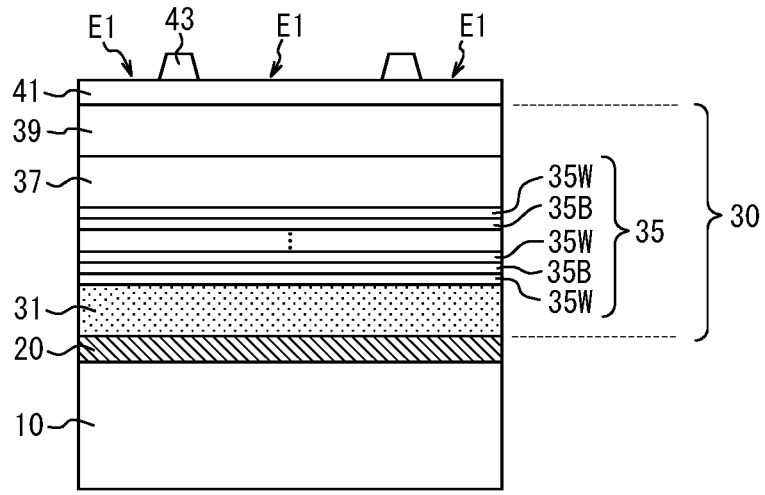
FIG. 2 is a schematic cross-sectional view subsequent to FIG. 1 illustrating parts of the steps for manufacturing the semiconductor light-emitting device according to an embodiment of the present disclosure.
Figure 2:
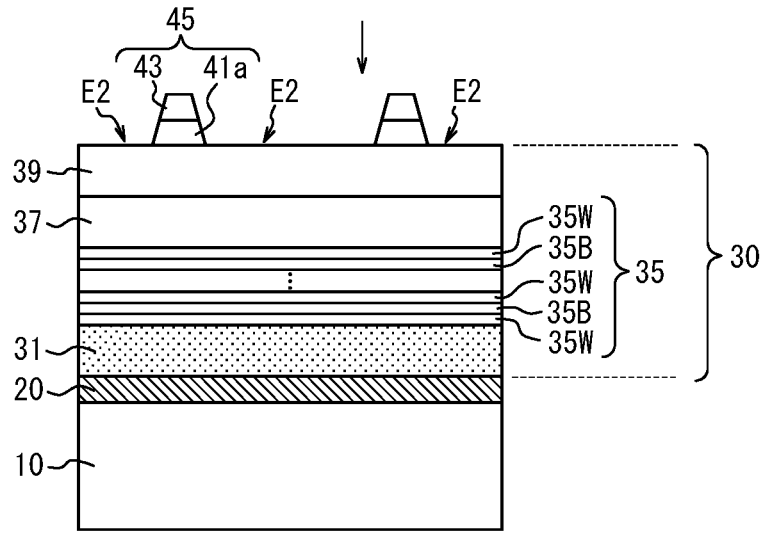
Figure 2:
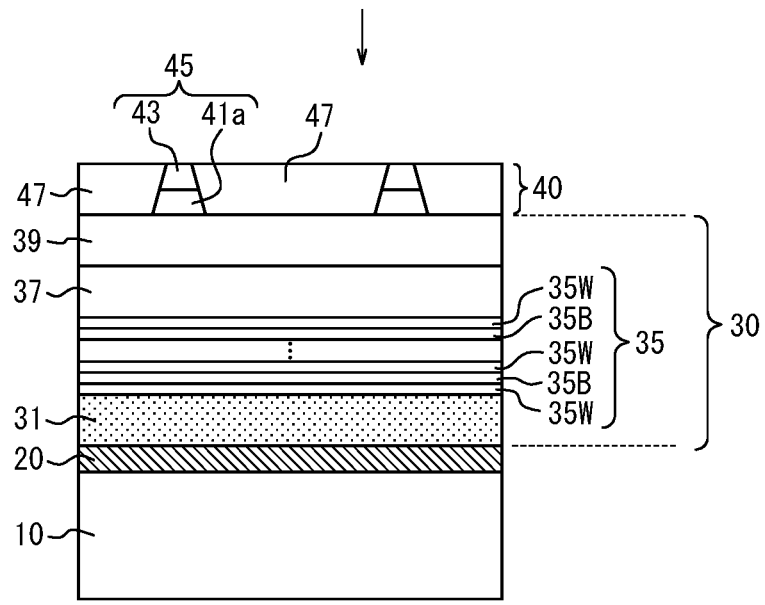

Subsequent to Step 32, the p-type contact layer 41 of the exposed area E1 is removed so that a surface of the semiconductor laminate 30 is exposed, thereby forming a p-type contact portion 45 composed of the ohmic metal portion 43 and the contact layer 41a and providing an exposed surface E2 of the semiconductor laminate 30 (Step 34 in FIG. 2). Specifically, the p-type contact layer 41 in an area other than the areas of the ohmic metal portion 43 that has been formed in the previous Step 32 is etched to expose a surface of the p-type cap layer 39 which is the outermost surface layer of the semiconductor laminate 30, thereby obtaining the contact layer 41a after the etching. For example, a resist mask may be formed on and around (approximately 2 μm to 5 μm of) the ohmic metal portion 43, and the exposed area E1 of the p-type contact layer 41 may be wet etched using a tartaric acid-hydrogen peroxide mixture. Alternatively, wet etching may be performed using an inorganic acid-hydrogen peroxide mixture, an organic acid-hydrogen peroxide mixture, or the like. Further, in the case where a mask is formed on the metal layer and etching is performed to form the ohmic metal portion 43 in Step 32, etching can be performed as Step 34 continuously to the etching of the p-type contact layer 41.

Note that the thickness of the p-type contact portion 45 corresponds to the total thickness of the p-type contact layer 41 (the p-type contact layer 41a after the etching) and the ohmic metal portion 43, and may be 350 nm to 1500 nm, more preferably 400 nm to 1000 nm.

Then, a dielectric layer 47 is formed on at least part of the exposed surface E2 of the semiconductor laminate 30 (Step 36 in FIG. 2). Such a dielectric layer 47 may be formed for example as follows.

First, a dielectric layer is deposited on the entire surface of the semiconductor laminate 30 so as to cover the semiconductor laminate 30 and the p-type contact portion 45. For the film deposition, a well-known technique such as plasma CVD or sputtering can be used. When a dielectric is deposited over the p-type contact portion after the film deposition, a mask may be formed as desired and the dielectric on the contact portion may be removed by etching or the like. For example, the dielectric on the contact portion may be wet etched using buffered hydrofluoric acid (BHTF) or the like. Thus, the intermediate layer 40 can be formed through Steps 30 to 36.

Figure 6:
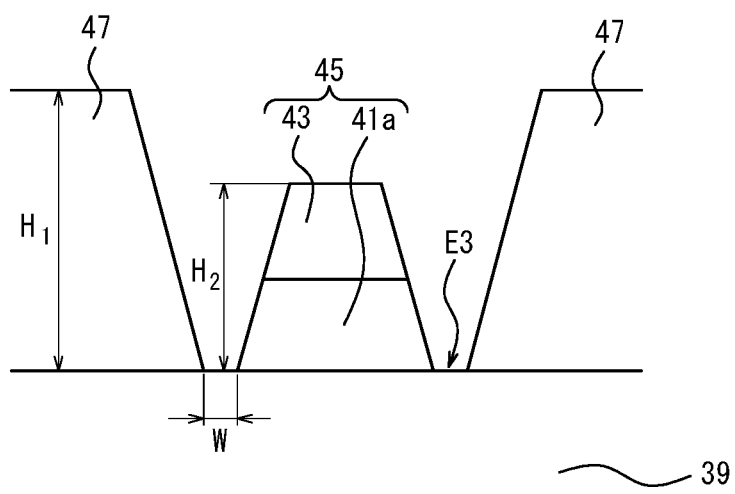
FIG. 6 is a schematic cross-sectional view illustrating a preferred mode of a vicinity of a dielectric layer and a p-type contact portion in a semiconductor light-emitting device according to a preferred embodiment of the present disclosure.

At this time, as illustrated in FIG. 6 while referring to Step 34 in FIG. 2, it is also preferred that the dielectric layer 47 is formed on a part of the exposed surface E2 of the semiconductor laminate 30 leaving an exposed portion E3 around the p-type contact portion 45, to thereby provide gaps between the dielectric layer 47 and the p-type contact portion 45. The dielectric layer 47 and the exposed portion E3 described above may be formed for example as follows. First, a dielectric layer is deposited on the entire surface of the semiconductor laminate 30, and a window pattern completely surrounding the contact portion is formed using a resist above the p-type contact portion 45 on the surface of the deposited dielectric layer. The dielectric around the contact portion is removed by etching using the thus formed resist pattern to thereby provide the exposed portion E3 around the p-type contact portion 40. In this case, the width W of the exposed portion E3 can be 0.5 μm or more and 5 μm or less.

Note that the relationship between the thickness $H_1$ of the dielectric layer 47 and the thickness $H_2$ of the p-type contact portion 45 formed in the dielectric layer formation step is not limited in particular; however, as illustrated in FIG. 6, when the thickness of the dielectric layer 47 is expressed as $H_1$ and the thickness of the contact portion is expressed as $H_2$, $H_1 \geq H_2$ can be satisfied, and $H_1 > H_2$ is preferably satisfied. This can further ensure the bonding of the reflective metal layer 60A to the metal bonding layer 60B. Note that, when the exposed portion E3 is provided and $H_1 > H_2$ is satisfied as illustrated in FIG. 6, formation of the reflective metal layer 60A so as to fill the gaps may cause generation of voids in parts between the metal bonding layer 60B and the reflective metal layer 60A (regions corresponding to the p-type contact portion and the gaps).

Moreover, the dielectric layer 47 may use $SiO_2$, SiN, ITO, AlN, and the like, and the dielectric layer 47 is preferably made of $SiO_2$ in particular. This is because $SiO_2$ can easily be processed by etching using BHF or the like. Further, a material transparent to light emitted from the semiconductor laminate 30 is preferably used for the dielectric layer 47.

<Surface Roughening Step>

Figure 7:
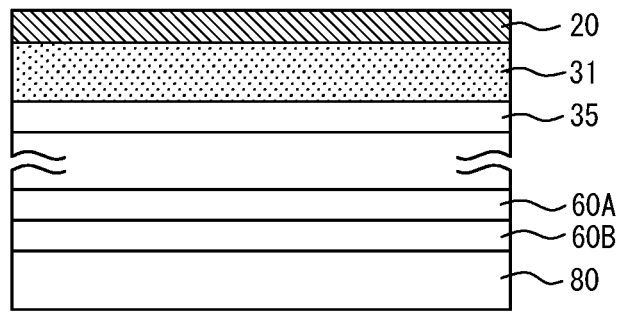
FIG. 7 is a schematic cross-sectional view illustrating a preferred embodiment in a method of manufacturing a semiconductor light-emitting device according to the present disclosure.
Figure 7:
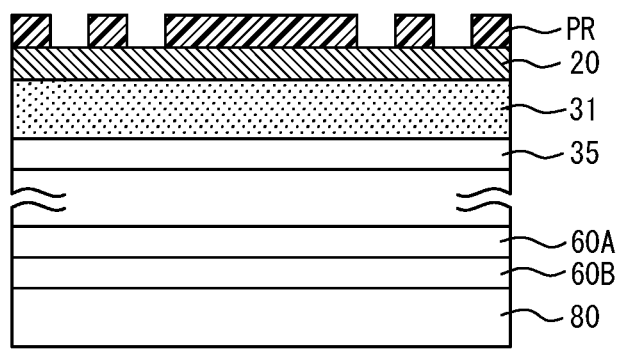
Figure 7:
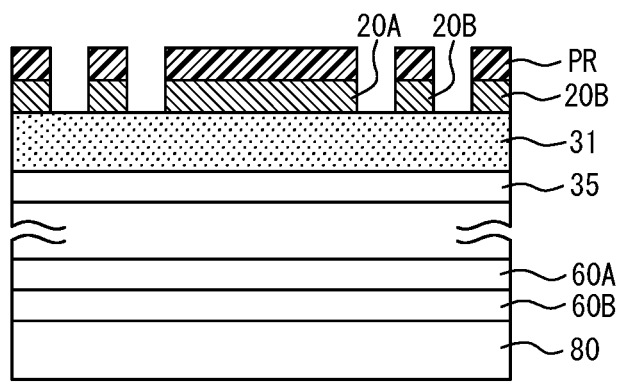
Figure 7:
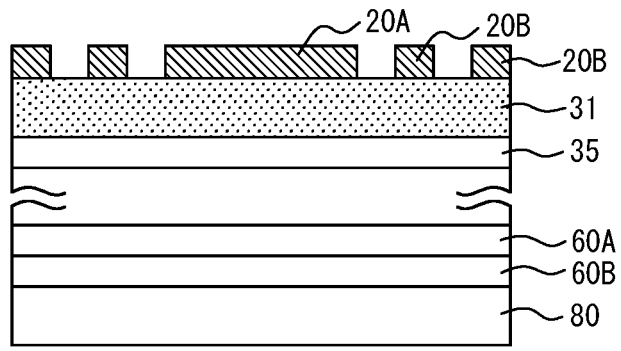
Figure 8:
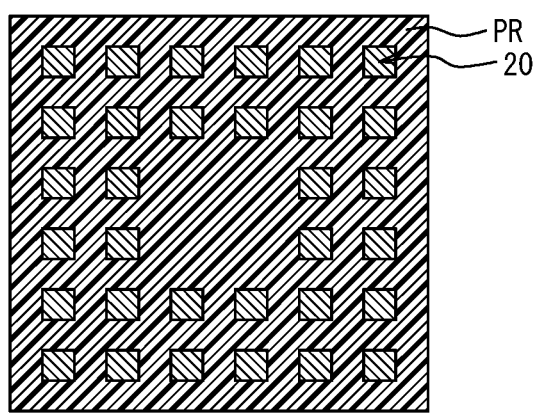
FIG. 8 is a schematic view of top views in Step 72 and Step 74 in FIG. 7.
Figure 8:
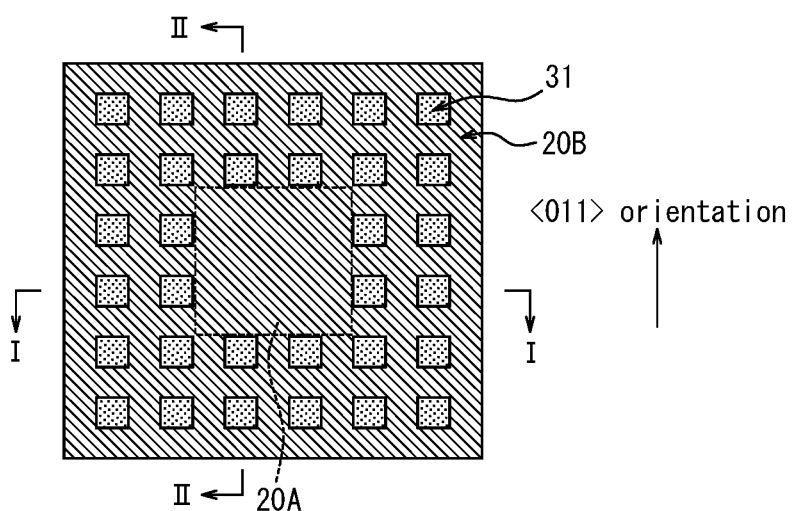
Figure 9:
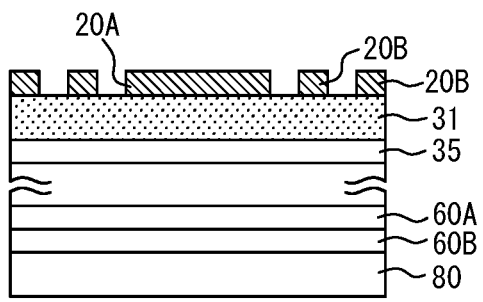
FIG. 9 is a schematic cross-sectional view subsequent to FIG. 7 illustrating the preferred embodiment in the method of manufacturing a semiconductor light-emitting device according to the present disclosure.
Figure 9:
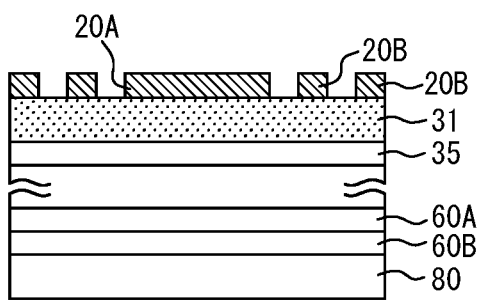
Figure 9:
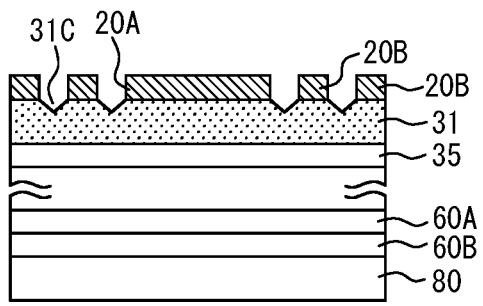
Figure 9:
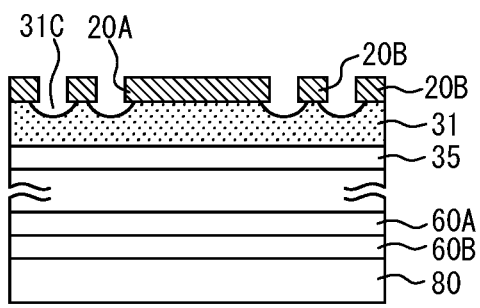
Figure 9:
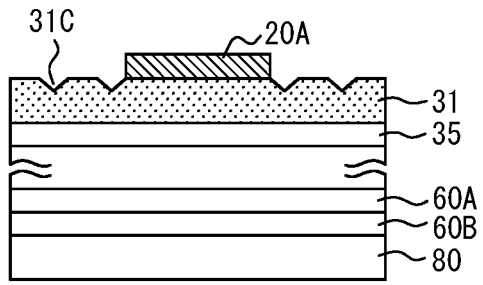
Figure 9:
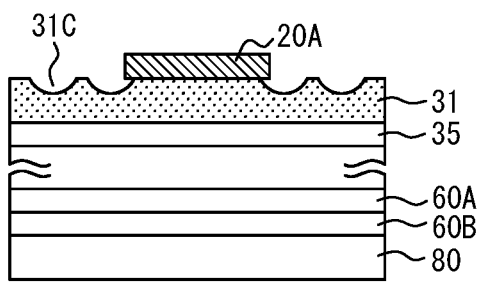

Upon etching for removing parts of the n-type InGaAs contact layer 20, it is also preferred to carry out a surface roughening on the surface of the semiconductor laminate 30 on the side of the n-type InP growth substrate (the surface of the n-type cladding layer 31 in Step 80 in FIG. 4). Referring to FIGS. 7 to 9, a preferred mode of the surface roughening step will be described. Although an n-side electrode 93 is not illustrated in FIGS. 7 to 9, the surface roughening step can be carried out similarly even in cases where an n-side electrode 93 has been formed.

As illustrated in Steps 71 to 74 in FIG. 7, in the surface roughening step, a first surface roughening step is carried out in which parts of the n-type InGaAs contact layer are etched to form a patterned mask portion 20B. Top views in Step 72 and Step 74 are illustrated in FIG. 8. Further, subsequent to the first surface roughening step, as illustrated in Steps 74 to Steps 76 in FIG. 9, a second surface roughening step is carried out in which the surface of the n-type cladding layer 31 is etched utilizing the patterned mask portion 20B. In the following, the details of the surface roughening step will be described in sequence.

<<First Surface Roughening Step>>

Step 71 in FIG. 7 corresponds to the state after the fifth step, i.e., the state after the n-type InP growth substrate 10 is removed. In a first surface roughening step, initially, a photoresist PR in a desired pattern is formed on the n-type InGaAs contact layer 20 (Step 72 in FIG. 7). For the patterning, a photoresist may be applied and an exposure may be carried out. An example of a schematic top view after the patterning in Step 72 is depicted in FIG. 8. The pattern of the photoresist PR can be transferred to the n-type InGaAs layer 20 by wet-etching the n-type InGaAs layer 20 using the photoresist PR as a mask (Step 73 in FIG. 7). The photoresist PR is then rinsed and removed as desired (Step 74 in FIG. 7). A schematic top view in Step 74 is depicted in FIG. 8. Note that any pattern is formed with the photoresist PR. FIG. 8 illustrates an example where the centers of the recesses are arranged two-dimensionally in a square lattice arrangement in the region other than the n-side electrode forming area 20A as the mask portion 20B, this is not limiting. Note that the two-dimensionally arranged pattern is preferably symmetric with respect to the <011> direction.

<<Second Surface Roughening Step>>

Subsequent to the first surface roughening step, in a second surface roughening step, the surface of the n-type InP cladding layer 31 is etched using the mask portion 20B of the n-type InGaAs layer 20 that has been patterned in the first surface roughening step, as a mask. An etchant solution of hydrochloric acid-acetic acid mixture or the like is preferably used for etching the n-type cladding layer 31. Note that the mask portion 20B of the n-type InGaAs layer 20 used as the mask can be removed by wet etching with an etching solution of sulfuric acid-hydrogen peroxide mixture (Step 76 in FIG. 9).

Here, the surface roughening step described above is particularly suitable for use when the n-type cladding layer is made of n-type InP. This is because InP is highly anisotropic, and the etch rates of InP vary significantly on different crystalline planes. Thus, the progresses of etching are different on the plane section I-I and on the plane section II-II (see FIG. 7), as illustrated in each step in FIG. 9. Specifically, recesses 31C are formed into V-shapes on the plane section I-I whereas etching proceeds also under the mask on the plane section II-II due to the difference in the etch rates. In cases where the n-type cladding layer 31 is made of n-type InP, if InP has been exposed beforehand and a typical resist has been formed on the surface of InP as a mask, the resist would peel off during etching due to an insufficient adhesion of the resist. Thus, surface roughening of the n-type cladding layer 31 by wet etching may become difficult. On the contrary, the surface roughening step as described above ensures surface roughening of the n-type cladding layer 31.

(Semiconductor Light-Emitting Device)

Next, a description will be given on the above-described semiconductor light-emitting device 100 fabricated through at least the first to seventh steps. As illustrated in FIG. 5, the semiconductor light-emitting device 100 includes a conductive support substrate 80, a metal layer 60 containing a reflective metal provided on the conductive support substrate 80, a semiconductor laminate 30 that is formed from a stack of a plurality of InGaAsP-based III-V compound semiconductor layers containing at least In and P provided on the metal layer 60, an n-type InGaAs contact layer 20A provided on the semiconductor laminate 30, and an n-side electrode 93 provided on the n-type InGaAs contact layer 20A, wherein the center emission wavelength of light emitted from the semiconductor laminate 30 is 1000 to 2200 nm.

The technical significance of the n-type InGaAs contact layer 20A used as an n-type contact layer in the semiconductor light-emitting device 100 will be described. When a bonding-type semiconductor light-emitting device is fabricated using an n-type InP growth substrate, an n-type semiconductor layer in a semiconductor laminate could be used as an n-type contact layer. Thus, an ohmic contact could be established between the n-side electrode and the n-type semiconductor layer. Referring to the reference numerals in FIG. 5, even in cases where an n-side electrode 93 is provided directly on the n-type cladding layer 31 without an n-type InGaAs contact layer being interposed between the n-side electrode 93 and the n-type cladding layer 31, an ohmic contact would be established therebetween. In the thus fabricated bonding-type semiconductor light-emitting device, however, we experimentally found that both the light output power and the forward voltage decreased over time. In contrast, it was experimentally found that the time degradations of the light output power and the forward voltage were suppressed by providing an n-type InGaAs contact layer 20 according to the present embodiment. The reason why time degradations can be suppressed in such a manner is considered in that n-type InGaAs prevents diffusion of the metal in the n-side electrode into the semiconductor layer, as compared with an InGaAsP-based III-V group compound semiconductor layer containing at least In and P.

Here, as described above, the In composition ratio z of the n-type InGaAs contact layer 20 is preferably 0.47 or more and 0.60 or less. Further, the n-side electrode 93 preferably contains one of Au and Ge, and Ti, Pt, and Au, also as described above.

Further, the semiconductor laminate 30 preferably includes a p-type cladding layer 37, active layers 35, and an n-type cladding layer 31 in this order from the side of the metal layer 60. Further, the light extraction region of the n-type cladding layer 31 is preferably roughened. As previously described in an embodiment of the manufacturing method, the semiconductor light-emitting device 100 may include additional components. For example, as illustrated in FIG. 5, a semiconductor light-emitting device 100 provided with a back electrode 91 and a semiconductor light-emitting device 100 having an intermediate layer 40 are also preferred embodiments. The intermediate layer 40 is formed as described above in an embodiment of the manufacture method, and has a contact portion 45 and a dielectric layer 47 provided so as to be parallel to each other between the metal layer 60 and the semiconductor laminate 30. By providing the semiconductor light-emitting device 100 with the intermediate layer 40, diffusion of current within the planes of the active layers is promoted, and transmission of light to the reflective metal layer 60A is also permitted.

EXAMPLES

Example 1

The present disclosure will be described in more detail below using Examples. However, this disclosure is not limited to the following Examples. Reference symbols in FIGS. 1 to 5 will be employed. A semiconductor light-emitting device according to Example 1 was fabricated as follows.

First, on the (100) plane of an n-type growth InP substrate 10, an n-type $In_{0.57}Ga_{0.43}As$ contact layer 20, an n-type InP cladding layer 31 (thickness: 2 µm), an i-type InP spacer layer (thickness: 300 nm), active layers 35 having a quantum well structure with an emission wavelength of 1300 nm (138 nm in total), an i-type InP spacer layer (thickness: 300 nm), a p-type InP cladding layer 32 (thickness: 1.2 μm), a p-type $In_{0.8}Ga_{0.20}As_{0.5}P_{0.5}$ cap layer 39 (thickness: 50 nm), and a p-type $In_{0.57}Ga_{0.43}As$ contact layer 41 (thickness: 130 nm) were sequentially formed by MOCVD. Upon forming the active layers 35 having the quantum well structure, an InP barrier layer (thickness: 8 nm) was formed first, and $In_{0.73}Ga_{0.27}As_{0.5}P_{0.5}$ well layers (thickness: 5 nm) and InP barrier layers (thickness: 8 nm) were then alternately and repeatedly stacked thereby forming a quantum well structure having 10.5 pairs of the layers.

Figure 10A:
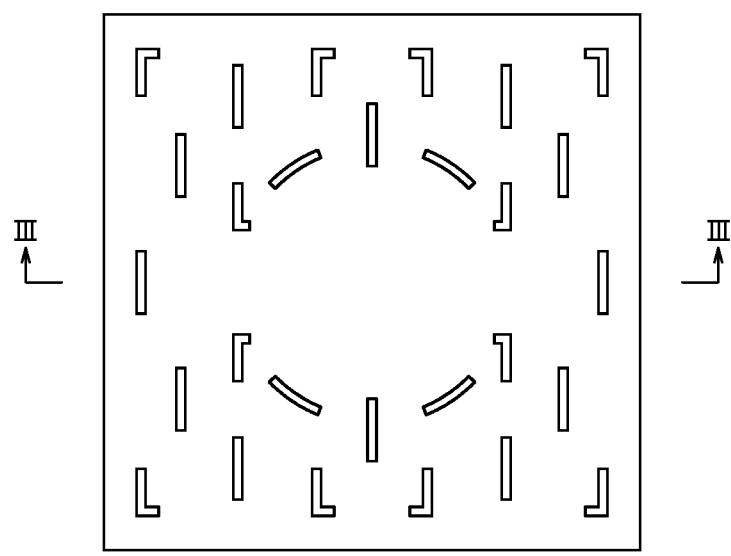
FIG. 10A is a schematic top view depicting a pattern of an ohmic electrode portion in Examples.

On the p-type $In_{0.57}Ga_{0.43}As$ contact layer 41, a p-type ohmic electrode portion 43 (Au/AuZn/Au, total thickness: 530 nm) was formed into islands distributed as illustrated in FIG. 10A. The plane section III-III of FIG. 10A corresponds to the schematic cross-sectional view of Step 32 in FIG. 2 (although no i-type InP spacer layer is illustrated). When forming this pattern, a resist pattern was formed and an ohmic electrode was then vapor deposited, followed by lift-off of the resist pattern. When the semiconductor layer of the wafer in this state was observed in a top view under an optical microscope, the contact area ratio of the p-type ohmic electrode portion 43 with respect to the semiconductor layer was 4.5%. Note that the outer size of the object depicted in FIG. 10A is 380 μm square.

Next, a resist mask was formed on and around the p-type ohmic electrode portion 43, and the p-type $In_{0.57}Ga_{0.43}As$ contact layer 41 was removed, except for areas where the ohmic electrode portion was formed, by wet etching using a tartaric acid-hydrogen peroxide mixture, to obtain a p-type $In_{0.57}Ga_{0.43}As$ contact layer 41a. After that, a dielectric layer 47 (thickness: 700 nm) made of $SiO_2$ was formed on the entire surface of the p-type $In_{0.80}Ga_{0.20}As_{0.50}P_{0.50}$ cap layer 39 by plasma CVD. A window pattern having a shape provided with additional 3-μm extensions each in the width direction and the longitudinal direction in an area above the p-type ohmic electrode portion 43 was formed using a resist, and the dielectric layer 47 on and around the p-type ohmic electrode portion 43 was removed by wet etching using BHF to expose the p-type $In_{0.80}Ga_{0.20}As_{0.50}P_{0.50}$ cap layer 39. At this time, the height (700 nm) of the dielectric layer 47 on the p-type $In_{0.80}Ga_{0.20}As_{0.50}P_{0.50}$ cap layer 39 was larger than the height (660 nm) of the p-type contact portion 45 composed of the p-type contact layer 41a (thickness: 130 nm) and the p-type ohmic electrode portion 43 (thickness: 530 nm) by 40 nm. When the semiconductor layer of the wafer in this state was observed in a top view under an optical microscope, the contact area ratio of the dielectric layer 47 ($SiO_2$) was 90%.

Next, a reflective metal layer (Al/Au/Pt/Au) was formed on the entire region of the surface of the p-type $In_{0.80}Ga_{0.20}As_{0.50}P_{0.50}$ cap layer 39 by vapor deposition. The thicknesses of the metal layers in the reflective metal layer 60A were 10 nm, 650 nm, 100 nm, and 900 nm in this order.

On the other hand, a metal bonding layer 60B (Ti/Pt/Au) was formed on a conductive Si substrate 80 serving as a support substrate (thickness: 300 μm). The thicknesses of the metal layers in the metal bonding layer 60B were 650 nm, 10 nm, and 900 nm in this order.

The reflective metal layer 60A and the metal bonding layer 60B were placed to face one another and were subjected to thermocompression bonding at 300° C. to bond them with Au—Au bonding. The n-type InP growth substrate 10 was then removed by wet etching with a hydrochloric acid diluent to expose the entire surface of the n-type InGaAs contact layer 20.

Figure 10B:
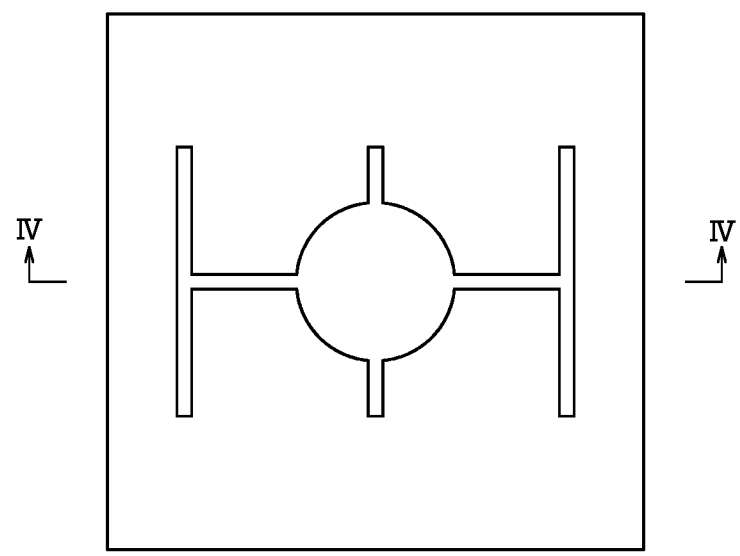
FIG. 10B is a schematic top view depicting a pattern of an n-side electrode in Examples.

Next, on the n-type InGaAs contact layer 20, an n-side electrode (Au (thickness: 10 nm)/Ge (thickness: 33 nm)/Au (thickness: 57 nm)/Ni (thickness: 34 nm)/Au (thickness: 800 nm)) was formed as a wiring portion 93a of an n-side electrode by resist patterning, vapor deposition of the n-side electrode, and lift-off of the resist pattern as illustrated in FIG. 10B. Thereafter, an ohmic contact was established between the n-type InGaAs contact layer 20 and the wiring portion 93a of the n-side electrode by a heat treatment (an ohmic contact between the p-type InGaAs contact layer 41a and the p-type ohmic electrode unit 43 was also established at this timing). Further, a pad portion 93b (Ti (thickness: 150 nm)/Pt (thickness: 100 nm)/Au (thickness: 2500 nm)) was formed at the center portion of the n-side electrode to obtain the n-side electrode having a pattern as illustrated in FIG. 10B.

Subsequently, the semiconductor layers between devices (width: 60 μm) were removed by mesa etching to form dicing lines.

Thereafter, the region of the n-type $In_{0.57}Ga_{0.43}As$ contact layer 20 other than the n-side electrode forming region 20A was removed by wet etching with a sulfuric acid-hydrogen peroxide mixture, to thereby expose the n-type InP cladding layer 31 except for the n-side electrode forming region 20A. The plane section IV-IV of FIG. 10B corresponds to Step 80 in FIG. 4. The outer size of the device depicted in FIG. 10B was 380 μm square as with FIG. 10A.

Then, after the Si substrate was thinned to a thickness of 87 μm by grinding, a back electrode (Ti (thickness: 10 nm)/Pt (thickness: 50 nm)/Au (thickness 200 nm)) was formed to the back surface of the Si substrate and chip singulation was performed by dicing. Note that the chip size was 350 μm×350 μm.

Example 2

A semiconductor light-emitting device according to Example 2 was fabricated in the same manner as in Example 1 except that the wiring portion 93a of the n-side electrode 93 was made from Ti (30 nm)/Pt (50 nm)/Au (450 nm).

Comparative Example 1

The same processes as in Example 1 were carried out up to the bonding of the reflective metal layer 60A and the metal bonding layer 60B and the removal of the n-type InP growth substrate 10 by wet etching using a hydrochloric acid dilute solution. Thereafter, the n-type $In_{0.57}Ga_{0.43}As$ contact layer was completely removed by wet etching with a sulfuric acid-hydrogen peroxide mixture, to expose the n-type InP cladding layer 31. Subsequently, an n-side electrode 93 was formed on the n-type InP cladding layer 31 in the same manner as in Example 1, and mesa etching, grinding of the Si substrate, provision of a back electrode on the back surface of the Si substrate, and chip singulation were carried out in the same manner as in Example 1, to fabricate a semiconductor light-emitting device according to Comparative Example 1. The final product of the semiconductor light-emitting device according to Comparative Example 1 was different from Example 1 in that an n-type InGaAs contact layer 20A was absent.

<Evaluation 1: Evaluation of Emission Characteristics>

For each of semiconductor light-emitting devices in Examples 1 and 2 and Comparative Example 1, a forward voltage Vf and a light output power Po using an integrating sphere were measured when a 20-mA current was fed by a constant current voltage power supply. The measurements were made on the respective 10 samples and the results were averaged. The results are listed in Table 1. The emission peak wavelengths of Example 1 and Conventional Example 1 were measured with an optical fiber spectrometer, and were both in a range between 1290 nm and 1310 nm.

<Evaluation 2: Evaluation of Time Deviations of Emission Characteristics>

Each of the semiconductor light-emitting devices according to Examples 1 and 2 and Comparative Example 1 was lit by supplying current for 100 hours under the same condition as Evaluation 1, and a forward voltage Vf and a light output power Po after 1000 hours were measured. Similarly to Evaluation 1, the measurements were made on the respective 10 samples of Examples 1 and 2 and Comparative Example 1, and the results were averaged. The results are listed in Table 1.

TABLE 1

| | Layer contacting n-side electrode | n-side electrode | Test Results | | | | |
|---|---|---|---|---|---|---|---|
| | | | Initial light output power Po (mV) | Sustained rate of light output power after 1000 hrs. | Initial forward voltage Vf (V) | Forward voltage Vf (V) after 1000 hrs. | Decrease in Vf (V) |
| Comp. Ex. 1 | n-type InP cladding layer | AgGe based | 2.54 | 0.869 | 0.953 | 1.028 | 0.075 |
| Ex. 1 | n-type InGaAs contact layer | AgGe based | 2.58 | 0.909 | 0.942 | 0.942 | 0.000 |
| Ex. 2 | n-type InGaAs contact layer | TiPtAu based | 2.66 | 0.936 | 0.953 | 0.952 | −0.001 |

It was confirmed from the above results that the sustained rate of the light output power Po was low and the forward voltage Vf was significantly increased due to the long-term current feeding in Comparative Example 1 since the n-type InP cladding layer 31 was in contact with the n-side electrode 93. In contrast, in Example 1, it was confirmed that a decrease in the sustained rate of the light output power Po after the 1000-hour current feeding and an increase in Vf were suppressed since the n-type InGaAs contact layer 20 was in contact with the n-side electrode 93. Further, in Example 2 which was different from Example 1 only in the electrode materials of the n-side electrode, it was confirmed that a decrease in the sustained rate of the light output power Po after the 1000-hour current feeding and an increase in Vf were suppressed similarly to the Example 1. Note that it was also confirmed that absorption of light by the n-type InGaAs contact layer 20 in the emission wavelengths of the semiconductor light-emitting device 100 had no effect on the light output power since the n-type InGaAs contact layer 20 was provided only directly below the n-side electrode as a contact layer.

INDUSTRIAL APPLICABILITY

According to the present disclosure, a bonding-type semiconductor light-emitting device having a center emission wavelength 1000 to 2200 nm, which has excellent reliabilities with smaller time deviations of the light output power and the forward voltage, and a method of manufacturing the same, can be provided.

REFERENCE SIGNS LIST 10 n-type InP growth substrate
20 n-type InGaAs contact layer
30 Semiconductor laminate
31 n-type cladding layer
35 Active layers
35W Well layer
35B Barrier layer
37 p-type cladding layer
39 p-type cap layer
40 Intermediate layer
41 (41a) p-type contact layer
43 Ohmic metal portion
45 p-type contact portion
47 Dielectric layer
60 Metal layer
60A Reflective metal layer
60B Metal bonding layer
80 Conductive support substrate
100 Semiconductor light-emitting device
91 Back electrode
93 n-side electrode
E1 Exposed area
E2 Exposed surface
E3 Exposed portion

The invention claimed is:

1. A method of manufacturing a semiconductor light-emitting device, comprising:
 a first step of forming an n-type InGaAs contact layer comprising an n-side electrode forming region, on an n-type InP growth substrate;
 a second step of forming a semiconductor laminate by stacking a plurality of InGaAsP-based III-V group compound semiconductor layers containing at least In and P, on the n-type InGaAs contact layer;
 a third step of forming a reflective metal layer on the semiconductor laminate;
 a fourth step of bonding a conductive support substrate having a surface provided with a metal bonding layer to the reflective metal layer, having the metal bonding layer interposed therebetween;
 a fifth step of removing the n-type InP growth substrate; and
 a sixth step of partially removing the n-type InGaAs contact layer to provide the semiconductor laminate with an exposed surface while forming an n-side electrode on the n-side electrode forming region of the n-type InGaAs contact layer,
 wherein a center emission wavelength of light emitted from the semiconductor laminate is 1000 to 2200 nm,
 the semiconductor laminate comprises an n-type cladding layer, active layers, and a p-type cladding layer, in this order from a side of the n-type InGaAs contact layer, an In composition ratio of the n-type InGaAs contact layer formed in the first step is set to 0.47 or more and 0.60 or less, and the active layer is MQW structure with multiple alternating InGaAsP well layes and InGaAsP barrier layers.

2. The method of manufacturing a semiconductor light-emitting device according to claim 1, wherein the n-side electrode contains one of Au and Ge, and Ti, Pt, and Au.

* * * * *